(12) United States Patent
Twynam

(10) Patent No.: US 7,126,171 B2
(45) Date of Patent: Oct. 24, 2006

(54) BIPOLAR TRANSISTOR

(75) Inventor: John Kevin Twynam, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 55 days.

(21) Appl. No.: 10/995,255

(22) Filed: Nov. 24, 2004

(65) Prior Publication Data
US 2005/0116319 A1   Jun. 2, 2005

(30) Foreign Application Priority Data

Nov. 28, 2003  (JP)  ............ P2003-399025
Nov. 8, 2004   (JP)  ............ P2004-323844

(51) Int. Cl.
*H01L 29/739* (2006.01)
*H01L 27/082* (2006.01)
*H01L 27/102* (2006.01)

(52) U.S. Cl. ............ 257/198; 257/197; 257/565; 257/552; 257/566; 257/571; 257/577; 257/593; 257/590; 257/586

(58) Field of Classification Search ............ 257/197, 257/198, 592, 587, 552, 566, 571, 577, 593, 257/590, 586
See application file for complete search history.

(56) References Cited

U.S. PATENT DOCUMENTS 5,132,764 A * 7/1992 Bayraktaroglu ............. 257/198
6,399,971 B1 * 6/2002 Shigematsu et al. ........ 257/197
6,867,477 B1 * 3/2005 Zheng et al. ............... 257/557

FOREIGN PATENT DOCUMENTS

JP    2002-368005 A    12/2002

* cited by examiner

*Primary Examiner*—Douglas W. Owens
*Assistant Examiner*—Samuel A. Gebremariam
(74) *Attorney, Agent, or Firm*—Birch, Stewart, Kolasch & Birch, LLP

(57) ABSTRACT

A bipolar transistor of the present invention comprises a collector layer made of an n-type semiconductor and an emitter layer made of an n-type semiconductor provided on this collector layer. A gate layer for injecting p-type carriers (holes) into the emitter layer is provided on the emitter layer. A p-type carrier retaining layer is formed between the collector layer and the emitter layer. The p-type carrier retaining layer temporarily retains the p-type carriers that are injected from the gate layer into the emitter layer and diffused in the emitter layer and reach the p-type carrier retaining layer. The bipolar transistor has a structure whose performance is not influenced by sheet resistance of the base layer, and is able to exhibit a high current gain even in a high-frequency region.

13 Claims, 15 Drawing Sheets

BIPOLAR TRANSISTOR

This nonprovisional application claims priority under 35 U.S.C. §119(a) on Patent Application Nos. P2003-399025 and P2004-323844 respectively filed in Japan on Nov. 28, 2003 and Nov. 8, 2004, the entire contents of which are hereby incorporated by reference.

BACKGROUND OF THE INVENTION

The present invention relates to bipolar transistors and, in particular, to a bipolar transistor that includes a compound semiconductor of a group III element and nitrogen (N) as a material.

As a type of bipolar transistor that includes a compound semiconductor of a group III element and nitrogen (N) as a material, there is known an HBT (heterojunction bipolar transistor) made of a gallium nitride/aluminum gallium nitride (GaN/AlGaN) material (refer to JP 2002-368005 A).

The HBT is provided with an n$^+$-gallium nitride (GaN) subcollector layer (thickness: ~1000 nm, silicon (Si) concentration as an n-type dopant: ~6×10$^{18}$ cm$^{-3}$), an n-GaN collector layer formed in a central region of the upper surface of this subcollector layer, a base layer made of an AlGaN/GaN alternating layer (superlattice) (total thickness is 150 nm, thickness of each GaN layer is ~3 nm, being undoped, and thickness of each AlGaN layer is ~1 nm, concentration of Mg as p-type dopant therein being ~1×10$^{19}$ cm$^{-3}$) and an AlGaN emitter layer (thickness: 150 nm, concentration of Si as n-type impurity: ~6×10$^{18}$ cm$^{-3}$) formed in a central region of the upper surface of this base layer on the upper surface of a semi-insulative substrate made of, for example, sapphire or silicon carbide (SiC) A collector electrode is formed in each of regions of the upper surface of the subcollector layer, which correspond to both sides of the collector layer. A base electrode is formed in each of regions of the upper surface of the base layer, which correspond to both sides of the emitter layer. An emitter electrode is formed on the emitter layer.

As mentioned in the above prior art example, with regard to the dopants normally used in the III-N compound semiconductor, the n-type dopant is Si, and the p-type dopant is Mg. However, in the III-N compound semiconductor, the activation rate of Mg is low, and the mobility of holes is low. Therefore, the sheet resistance of the p-type base layer becomes high.

For example, in the case of a uniform base layer made of GaN, even if the acceptor concentration of Mg as the p-type dopant is set up to 5×10$^{19}$ cm$^{-3}$, there is caused a hole concentration of only about 8×10$^{17}$ cm$^{-3}$. Therefore, the sheet resistance of the base layer comes to have a high value of 100 kΩ/□. The same thing can be said for the superlattice base layer in the HBT of JP 2002-368005 A.

Therefore, the conventional HBT has a problem that the base resistance $r_b$ becomes high, and the power gain is low in the high-frequency region.

A unilateral power gain (represented by a symbol U(f)) at a frequency f in the high-frequency region of the HBT that has the uniform base layer is expressed by the following equation (1):

$$U(f) = f_T/(8\pi r_b C_c f^2) \quad (1)$$

where $f_T$ represents the current gain cutoff frequency, $r_b$ represents the base resistance value and $C_c$ represents the collector capacitance.

SUMMARY OF THE INVENTION

Accordingly, an object of this invention is to provide a bipolar transistor, which has a structure whose performance is not influenced by the sheet resistance of the base layer and is able to exhibit a high current gain even in a high-frequency region.

Another object of this invention is to provide an electronic apparatus (particularly the base station for portable telephones, the base station for a wireless LAN or the like) of low power consumption by providing a bipolar transistor that can exhibit a high current gain even in the high-frequency region.

In order to solve the aforementioned problems, the bipolar transistor of this invention comprises:

a collector layer which is made of a first conductive type semiconductor;

an emitter layer which is made of a first conductive type semiconductor provided on the collector layer;

a gate layer which is provided on the emitter layer and intended to inject second conductive type carriers into the emitter layer; and a second conductive type carrier retaining layer which is formed between the collector layer and the emitter layer and temporarily retains the second conductive type carriers that are injected from the gate layer into the emitter layer and diffused in the emitter layer and reach the carrier retaining layer.

In this case, the "first conductive type" means one of the n-type and the p-type, and the "second conductive type" means the other of the n-type and the p-type.

The "first conductive type semiconductor" means one in which a semiconductor as a parent material is doped with impurities of the first conductive type so as to serve as the first conductive type. Likewise, the "second conductive type semiconductor" means one in which a semiconductor as a parent material is doped with impurities of the second conductive type so as to serve as the second conductive type.

Moreover, the operation of the second conductive type carrier retaining layer to "temporarily retain" the second conductive type carriers means that the layer retains the second conductive type carriers at least during a period, in which the second conductive type carriers that diffuse through the emitter layer and reach the second conductive type carrier retaining layer become recombined with the first conductive type carriers that are injected from the emitter layer into the second conductive type carrier retaining layer.

In the bipolar transistor of this invention, a forward bias is applied between the gate layer and the emitter layer during operation, so that the second conductive type carriers are injected from the gate layer into the emitter layer. The second conductive type carriers injected from the gate layer into the emitter layer diffuse in the emitter layer mainly in a direction perpendicular to this emitter layer (this direction being referred to as a "vertical direction") and reach the second conductive type carrier retaining layer. Then, the second conductive type carriers are retained in the second conductive type carrier retaining layer, and the second conductive type carriers in the second conductive type carrier retaining layer become excessive, so that a forward bias state is established between the emitter layer and the second conductive type carrier retaining layer. This consequently causes injection of the first conductive type carriers from the emitter layer to the second conductive type carrier retaining layer. Then, the excessive second conductive type carriers retained in the second conductive type carrier retaining layer are all recombined with (a part of) the injected first conductive type carriers. At this time, the majority of the first conductive type carriers injected from the emitter layer to the second conductive type carrier retaining layer pass through the second conductive type carrier retaining layer and reach the collector layer. That is, the first conductive type carriers flow in the vertical direction from the emitter layer to the collector layer through the second conductive type carrier retaining layer. The transistor operates as described above.

As described above, in the bipolar transistor of this invention, the second conductive type carriers injected from the gate layer into the emitter layer diffuse mainly in the vertical direction in the emitter layer and reach the second conductive type carrier retaining layer. That is, in the bipolar transistor of this invention, the second conductive type carriers substantially do not move in the direction (transverse direction) parallel to the layer direction, and there is no need for such the operation, dissimilarly to the conventional HBT. Therefore, the performance of the bipolar transistor of this invention is not influenced by the sheet resistance of the base layer dissimilarly to the conventional HBT. As a result, the bipolar transistor of this invention can exhibit a high current gain even in the high-frequency region.

In the bipolar transistor of one embodiment, the collector layer is formed on a certain substrate.

In the bipolar transistor of this one embodiment, since the substrate has a mechanical strength, it becomes easy to fabricate and handle this bipolar transistor. A semi-insulative substrate made of, for example, sapphire or silicon carbide (SiC) can be enumerated as the substrate.

The bipolar transistor of one embodiment comprises a subcollector layer which is made of a first conductive type semiconductor formed along the substrate between the collector layer and the substrate and is doped with a higher concentration of first conductive type impurity than the collector layer.

In the bipolar transistor of one embodiment, the subcollector layer is doped with the first conductive type impurity with a concentration higher than that of the collector layer. Therefore, by providing the collector electrode in contact with the subcollector layer, ohmic contact with the collector electrode is easily achieved. Moreover, since the resistance of the subcollector layer becomes lower than the resistance of the collector layer, the series resistance of the entire collector (collector layer and subcollector layer) is reduced. Moreover, since the resistance of the collector layer can be set low, the withstand voltage is raised, and the output capacitance is reduced. Therefore, the performance of this bipolar transistor is improved.

In the bipolar transistor of one embodiment, the collector layer is formed in a partial region on the subcollector layer, a collector electrode is provided in a region of an upper surface of the subcollector layer corresponding to a side of the collector layer, the gate layer is formed in a partial region on the emitter layer, an emitter electrode is provided in a region of the upper surface of the emitter layer corresponding to a side of the gate layer, and a gate electrode is provided on the gate layer.

In the bipolar transistor of this one embodiment, there can be connected an external circuit for applying the respective predetermined bias voltages to the collector electrode, the emitter electrode and the gate electrode during operation. By applying the respective predetermined bias voltages to the collector electrode, the emitter electrode and the gate electrode, the aforementioned transistor operation is easily achieved.

In the bipolar transistor of one embodiment, an energy bandgap of the emitter layer is narrower than an energy bandgap of the gate layer.

In the bipolar transistor of this one embodiment, the energy bandgap of the emitter layer is narrower (smaller) than the energy bandgap of the gate layer, and therefore, the injection efficiency of the second conductive type carriers from the gate layer into the emitter layer is increased. Therefore, the performance of this bipolar transistor is further improved.

In the bipolar transistor of one embodiment, the second conductive type carrier retaining layer is a base layer which is made of a second conductive type semiconductor.

In the bipolar transistor of this one embodiment, the second conductive type carrier retaining layer, which is the base layer made of the second conductive type semiconductor, is therefore easily formed by the well-known crystal growth method. In short, it is proper to laminate the semiconductor layers in the order of the collector layer, the base layer and the emitter layer. These three layers would suffice if processed into the same pattern.

In the bipolar transistor of one embodiment, an energy bandgap of the base layer is narrower than an energy bandgap of the emitter layer.

In the bipolar transistor of this one embodiment, the energy bandgap of the base layer is narrower (smaller) than the energy bandgap of the emitter layer, and therefore, the injection efficiency of the first conductive type carriers from the emitter layer to the base layer is increased. Therefore, the performance of this bipolar transistor is further improved.

In the bipolar transistor of one embodiment, the second conductive type carrier retaining layer is a spontaneous polarization layer which is generated at an interface between the collector layer and the emitter layer.

In the bipolar transistor of this one embodiment, the second conductive type carrier retaining layer is the spontaneous polarization layer which is generated at the interface between the collector layer and the emitter layer. Therefore, it is not required to purposely form the second conductive type carrier retaining layer in the fabricating stage of this transistor. In short, it is proper to laminate the semiconductor layers in the order of the collector layer and the emitter layer by the well-known crystal growth method. These two layers would suffice if processed into the same pattern.

In the bipolar transistor of one embodiment, a crystalline material which constitutes each of the layers is a compound semiconductor made of a group III element and nitrogen, and the first conductive type is n-type, and the second conductive type is p-type.

As already described, in the conventional npn transistor that includes the compound semiconductor of a group III element and nitrogen, the sheet resistance of the p-type base layer is high, and therefore, the power gain in the high-frequency region is reduced. Therefore, if an npn transistor that includes the compound semiconductor of a group III element and nitrogen as the material thereof as in the bipolar transistor of this one embodiment, the degree of tolerated improvement in the performance of the transistor is particularly great.

In the bipolar transistor of one embodiment, a crystalline material that constitutes the gate layer is AlGaN, a crystalline material that constitutes the emitter layer is GaN, a crystalline material that constitutes the base layer is InGaN, a crystalline material that constitutes the collector layer is InGaN, and the first conductive type is n-type, and the second conductive type is p-type.

According to the bipolar transistor of this one embodiment, a bipolar transistor that can exhibit a high current gain even in the high-frequency region is provided.

In the bipolar transistor of one embodiment, a crystalline material that constitutes the gate layer is AlGaN, a crystalline material that constitutes the emitter layer is GaN, a crystalline material that constitutes the collector layer is InGaN, and the first conductive type is n-type, and the second conductive type is p-type.

According to the bipolar transistor of this one embodiment, the bipolar transistor that can exhibit a high current gain even in the high-frequency region is provided.

In the bipolar transistor of one embodiment, a crystalline material that constitutes the emitter layer is GaN, and the emitter layer has a thickness of not greater than 200 nm.

In the bipolar transistor of this one embodiment, the thickness of the GaN emitter layer is not greater than 200 nm. Therefore, the second conductive type carriers (i.e., holes that are the p-type carriers) injected from the gate layer into the GaN emitter layer are able to diffuse in the vertical direction in the GaN emitter layer and to reach the second conductive type carrier retaining layer.

Moreover, from the viewpoint of the high-frequency characteristic, the thickness of the emitter layer should more preferably be not greater than 100 nm. That is, there is demanded the following equation (2):

$$x_e < sqrt[Dp/(\pi f)] \quad (2)$$

where $x_e$ represents the thickness of the emitter layer, Dp represents the hole diffusion coefficient (=0.3 cm$^2$/s) in the emitter layer and is calculated on the basis of measurement, and f represents the frequency.

According to the equation (2), it is preferable that $x_e < 100$ nm when f=1 GHz.

It can be said that the thickness $x_e$ of the emitter layer should preferably be further reduced to, for example, 80 nm or 50 nm as the frequency f is increased.

In the bipolar transistor of one embodiment, a surface of each of the layers is a (000-1) surface.

In the bipolar transistor of this one embodiment, the surface of each of the layers is the (000-1) surface, and therefore, the spontaneous polarization layer is easily generated at the interface between the collector layer and the emitter layer. Therefore, the second conductive type carrier retaining layer can easily be constituted of the spontaneous polarization layer.

Furthermore, by providing an electronic apparatus with the bipolar transistor of the present invention, the electronic apparatus of low power consumption can be provided.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
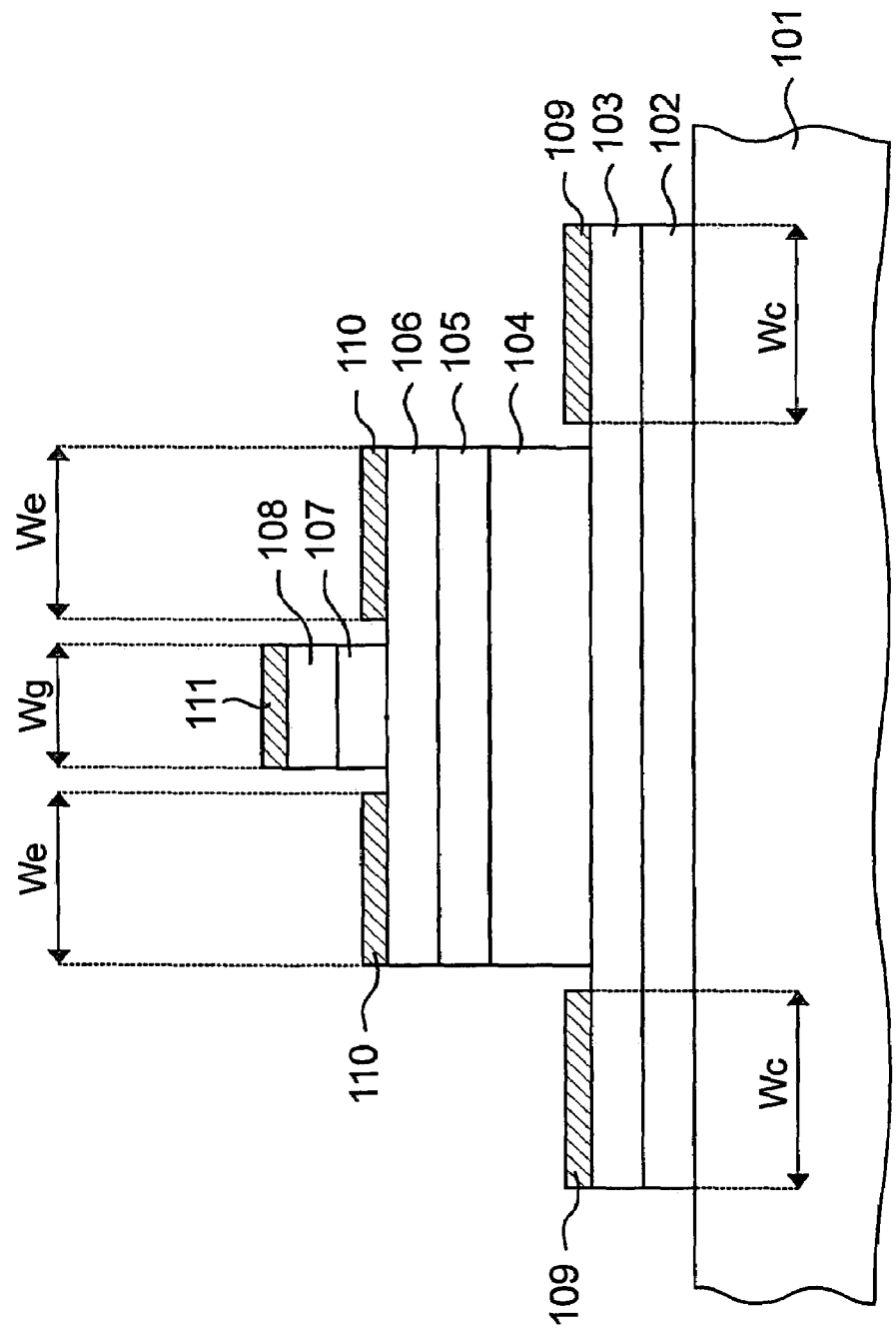
FIG. 1 is a view showing the cross-sectional structure of a first example of the bipolar transistor of this invention.

The bipolar transistor of this invention (hereinafter properly referred to as a "device") will be described in detail below on the basis of the embodiments shown in the drawings.

It is to be noted that "n-" represents the n-type as the first conductive type and "p-" represents the p-type as the second conductive type in the following description. The denotations of "n$^+$" and "p$^+$" imply that the symbol "+" represents a high impurity concentration, and the denotations of "n$^-$" and "p$^-$" imply that the symbol "−" represents a low impurity concentration.

Moreover, $N_d$ represents the doping concentration of the first conductive type impurity (Si in this example), and $N_a$ represents the doping concentration of the second conductive type impurity (Mg in this example).

The first conductive type carriers are electrons, and the second conductive type carriers are holes.

(The First Embodiment)

Figure 7:
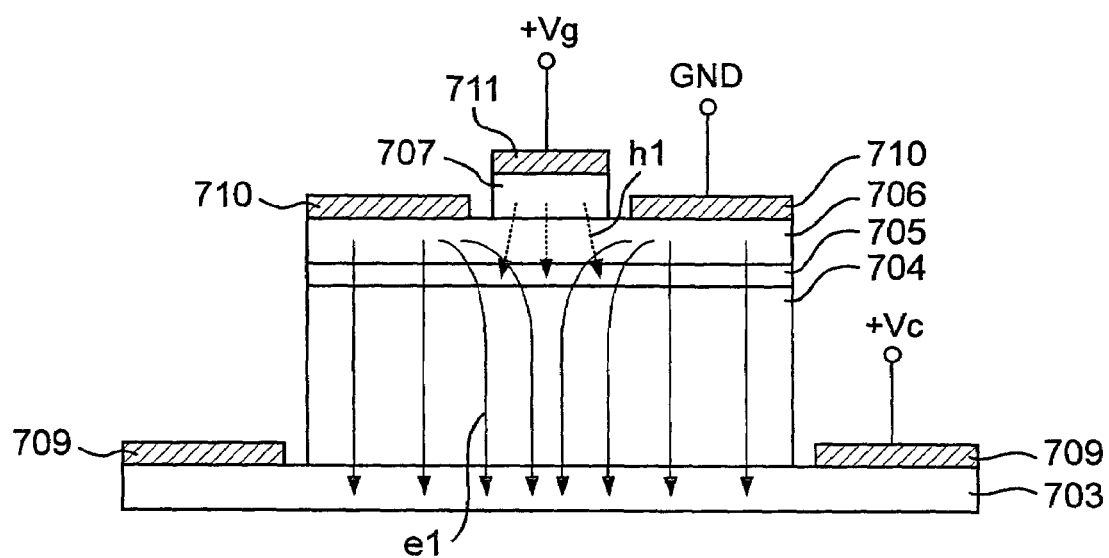
FIG. 7 is a view showing the cross-sectional structure of a bipolar transistor of a first embodiment to which this invention is applied.

FIG. 7 shows the cross-sectional structure of the device of the first embodiment to which this invention is applied.

This device is provided with an n-GaN subcollector layer (layer thickness: 100 nm, $N_d$=5×10$^{18}$ cm$^{-3}$) 703, an n-In$_x$Ga$_{1-x}$N collector layer (layer thickness: 500 nm, In composition ratio x=0→0.2, $N_d$=1×10$^{16}$ cm$^{-3}$) 704 formed in a central region of the upper surface of this subcollector layer 703, a p-$In_{0.2}Ga_{0.8}N$ base layer (layer thickness: 25 nm, $N^a=5\times10^{19}$ cm$^3$) 705 that serves as a second conductive type carrier retaining layer, an n-GaN emitter layer (layer thickness: 80 nm, $N_d=5\times10^{18}$ cm$^{-3}$) 706 and a p-$Al_{0.2}Ga_{0.8}N$ gate layer (layer thickness: 50 nm, $N_a=5\times10^{18}$ cm$^{-3}$) 707 formed in a central region of the upper surface of this emitter layers 706. The In crystal mixture ratio x of the n-$In_xGa_{1-x}N$ collector layer 704 is graded so that x=0 on the subcollector layer side and x=0.2 on the base layer side. The collector layer 704 is also called the "transit layer".

Collector electrodes 709 and 709 are formed in regions of the upper surface of the subcollector layer 703 corresponding to both sides of the collector layer 704. Emitter electrodes 710 and 710 are formed in regions of the upper surface of the emitter layer 706 corresponding to both sides of the gate layer 707. Moreover, a gate electrode 711 is formed on the upper surface of the gate layer 707. The collector electrodes 709, the emitter electrodes 710 and the gate electrode 711 are put in ohmic contact with the subcollector layer 703, the emitter layer 706 and the gate layer 707, respectively, which are located just under the electrodes.

That is, this device has the semiconductor layers of p$^+$, n$^+$, p$^+$, n$^-$ and n$^+$ (n$^-$ corresponds to the collector layer 704) arranged in order from the upper side. The base layer 705 is provided with no electrode and electrically floating.

The semiconductor layers 703, 704, 705, 706 and 707 are successively laminated by, for example, the molecular beam epitaxial growth method (MBE) and processed for patterning by the mesa etching method. The electrodes 709, 710 and 711 are vapor-deposited and processed for patterning by the lift-off method.

In this device, during operation, the gate electrode 711 is used as an input terminal, and the collector electrode 709 is used as an output terminal. For example, the emitter electrode 710 is grounded (GND), and a positive voltage (+Vg: gate voltage bias) is applied to the gate electrode 711, so that a forward bias is applied (to a p$^+$n$^+$ junction) between the gate layer 707 and the emitter layer 706. Moreover, a positive voltage (+Vc: collector voltage bias) is applied to the collector electrode 709, so that a reverse bias state is established (at a n$^+$n$^-$p$^+$ junction) between each of the subcollector layer 703 and the collector layer 704 and the base layer 705.

A forward bias is applied between the gate layer 707 and the emitter layer 706, and therefore, holes are first injected from the gate layer 707 into the emitter layer 706. The holes injected from the gate layer 707 into the emitter layer 706 diffuse mainly in the vertical direction (indicated by the arrow h1 in FIG. 7) in the emitter layer 706 and reach the base layer 705. Then, the holes are retained in the base layer 705, and the holes in the base layer 705 become excessive, so that a forward bias state is established between the emitter layer 706 and the base layer 705. Consequently, there is caused injection of electrons from the emitter layer 706 into the base layer 705. Then, the excessive holes retained in the base layer 705 are all recombined with (a part of) the injected electrons. At this time, the majority of the electrons injected from the emitter layer 706 into the base layer 705 pass through the base layer 705 and reach the collector layer 704 and the subcollector layer 703. That is, the electrons flow in the vertical direction (indicated by the arrow e1 in FIG. 7) from the emitter layer 706 to the collector layer 704 and the subcollector layer 703 through the base layer 705.

The transistor operates as described above. Since the current of electrons is larger than the current of holes, a current gain is caused.

As described above, in the bipolar transistor of this invention, the holes injected from the gate layer 707 into the emitter layer 706 diffuse mainly in the vertical direction in the emitter layer 706 and reach the base layer 705. That is, in the bipolar transistor of this invention, the second conductive type carriers substantially do not move in the transverse direction, and there is no need for such the operation, dissimilarly to the conventional HBT. Therefore, the performance of the bipolar transistor of this invention is not influenced by the sheet resistance of the base layer dissimilarly to the conventional HBT. As a result, the bipolar transistor of this invention can exhibit a high current gain even in the high-frequency region.

Figure 8:
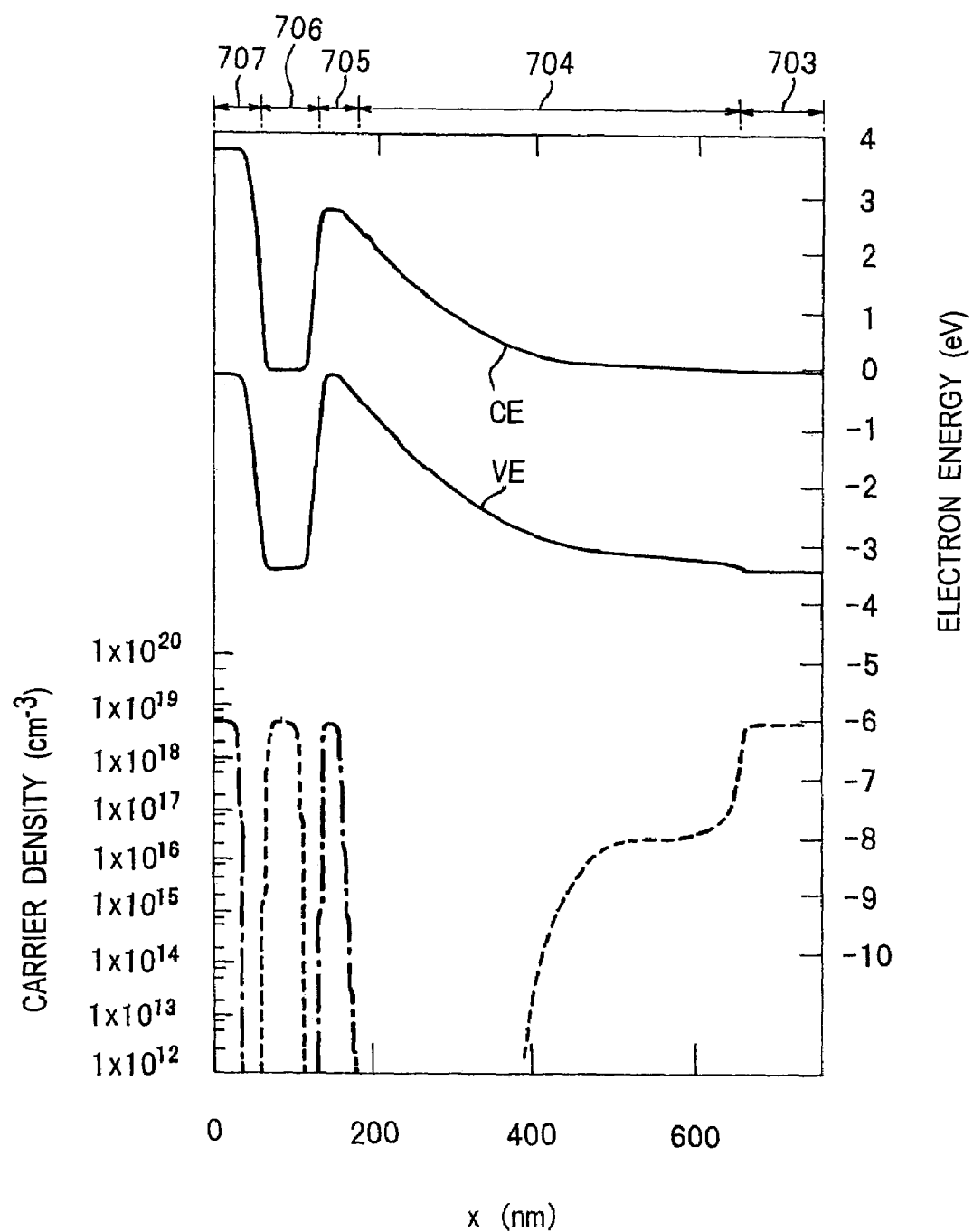
FIG. 8 is a graph showing the energy band and the densities of electrons and holes of the device shown in FIG. 7 in a thermal equilibrium state.

FIG. 8 shows the energy band and the concentrations of electrons and holes as the result of simulating the device of FIG. 7 by means of a simulation model. In the figure, the horizontal axis represents a distance x from the gate electrode 711 in the vertical direction. For easy understanding, the ranges of the layers 707, 706, 705, 704 and 703 are shown in an upper marginal space. In the graph of the energy band shown in an upper portion inside the frame, the solid line CE indicates the lower end of the conduction band, and the solid line VE indicates the upper end of the valence band. In the carrier density shown in a lower portion inside the frame, the dashed line indicates the density of electrons of the n-type carriers, and the one-dot chain line indicates the concentration of holes of the p-type carriers. This manner of illustration is similar also in FIGS. 9, 11 and 13 described later. In this FIG. 8, no voltage bias is applied to each layer, and a thermal equilibrium state is established.

Figure 9:
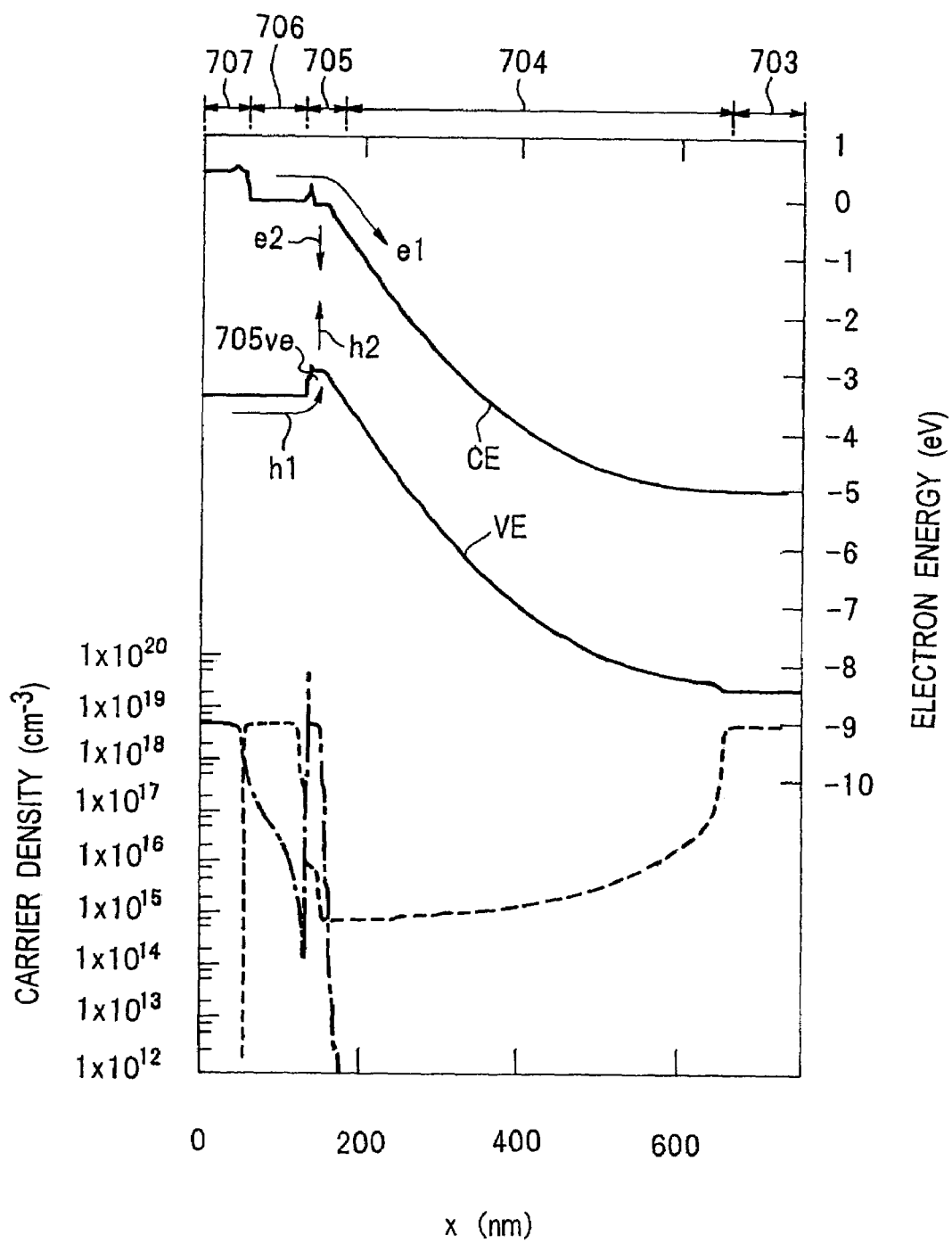
FIG. 9 is a graph showing the energy band and the densities of electrons and holes of the device shown in FIG. 7 during operation.

FIG. 9 shows the energy band and the densities of electrons and holes as the result of simulating the device of FIG. 7 in a state in which a bias is applied. In this case, a collector voltage bias Vc is +5V, and a gate voltage bias Vg is +3.3V. The arrow h1 in FIG. 9 indicates the holes that are injected from the gate layer 707 into the emitter layer 706 and diffuse in the emitter layer 706 and reach (the neighborhood of an edge 705ve of the valence band of) the base layer 705 similarly to the arrow h1 in FIG. 7. Moreover, the arrow h2 in FIG. 9 indicates holes that are recombined with a part (indicated by the arrow e2 in FIG. 9) of electrons injected from the emitter layer 706 into the base layer 705. Moreover, the arrow e1 in FIG. 9 indicates the electrons that flow from the emitter layer 706 to the collector layer 704 and the subcollector layer 703 through the base layer 705.

A direct current gain $\beta_0$ of this device is expressed by the following equation (3):

$$\beta_0 = \alpha_1\alpha_2/(1-\alpha_2) \tag{3}$$

where $\alpha_1$ represents the probability of the migration of holes without recombination through the emitter layer 706, $\alpha_2$ represents the probability of the migration of electrons without recombination through the base layer 705. There is a possibility that the direct current gain $\beta_0$ is increased so long as $\alpha_2$ is close to one even when the emitter layer 706 is thick to a certain extent and $\alpha_1$ is low. For example, $\beta_0 \approx 100$ assuring a practicable level so long as $\alpha_2$ is close to 1 as in the case where $\alpha_2=0.9999$ even when $\alpha_1$ has a low value of 0.01.

The thickness of the emitter layer 706 should preferably be not greater than 200 nm. The above is because the holes are able to migrate without recombination through the emitter layer 706 and to reach the base layer 705 so long as the thickness of the emitter layer 706 is not greater than 200 nm.

(The Second Embodiment)

Figure 10:
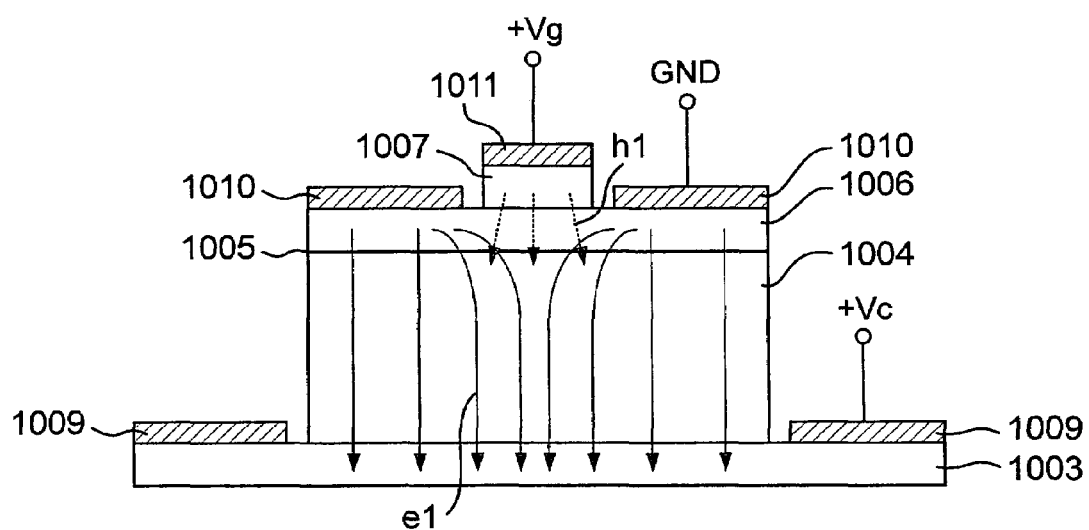
FIG. 10 is a view showing the cross-sectional structure of a bipolar transistor of a second embodiment to which this invention is applied.

FIG. 10 shows the cross-sectional structure of the device of the second embodiment to which this invention is applied.

This device is provided with an n-GaN subcollector layer (layer thickness: 100 nm, $N_d=5\times10^{18}$ cm$^{-3}$) 1003, an n-In$_x$Ga$_{1-x}$N collector layer (layer thickness: 500 nm, In composition ratio x=0→0.2, $N_d=1\times10^{16}$ cm$^{-3}$) 1004 formed in a central region of the upper surface of this subcollector layer 1003, an n-GaN emitter layer (layer thickness: 80 nm, $N^d=5\times10^{18}$ cm$^{-3}$) 1006 and a p-Al$_{0.2}$Ga$_{0.8}$N gate layer (layer thickness: 50 nm, $N_a=5\times10^{18}$ cm$^{-3}$) 1007 formed in a central region of the upper surface of this emitter layer 1006. The In crystal mixture ratio x of the n-In$_x$Ga$_{1-x}$N collector layer 1004 is graded so that x=0 on the subcollector layer side and x=0.2 on the emitter layer side.

A collector electrode 1009, an emitter electrode 1010 and a gate electrode 1011 are formed similarly to those of the first embodiment. The collector electrode 1009, the emitter electrode 1010 and the gate electrode 1011 are put in ohmic contact with the subcollector layer 1003, the emitter layer 1006 and the gate layer 1007, respectively, which are located just under the electrodes.

As understood, the structure of this device corresponds to one obtained by eliminating the p-In$_{0.2}$Ga$_{0.8}$N base layer 705 from the device of the first embodiment. The structure of this device will be described next.

At an interface of a heterojunction constituted of compound semiconductors of a group III element and nitrogen (N), polarized electric charge exists due to spontaneous polarization. This polarized electric charge is caused mainly by a difference in the spontaneous polarization between the semiconductor materials. Therefore, in the construction of the semiconductor layers in the device of the first embodiment, a two-dimensional hole gas (2DHG) is generated at the interface of the heterojunction constituted of the emitter layer 706 and the base layer 705 and the interface of the heterojunction constituted of the gate layer 707 and the emitter layer 706. If the density of the 2DHG generated at the interface of the heterojunction constituted of the emitter layer 706 and the base layer 705 is sufficiently high, then a device that similarly operates is provided even in the absence of the base layer 705.

Accordingly, in the device of this second embodiment, the base layer is eliminated as already described, and the n-GaN emitter layer 1006 is provided directly on the n-In$_x$Ga$_{1-x}$N collector layer 1004. Consequently, an interface (including its neighborhood region, hereinafter referred to as a "2DHG layer") 1005 between the emitter layer 1006 and the collector layer 1004 operates as a second conductive type carrier retaining layer.

In order to increase the electric charge density of the spontaneous polarization at the heterojunction interface, the surface of each semiconductor layer should preferably be the (000-1) surface.

The semiconductor compositions of the emitter layer and the collector layer may be largely different from each other. However, the lattice strain becomes too high and an increase in dislocation density occurs when the difference in the semiconductor composition is excessively large. Consequently, there occurs a problem that a leakage current between the emitter and the collector increases.

Figure 11:
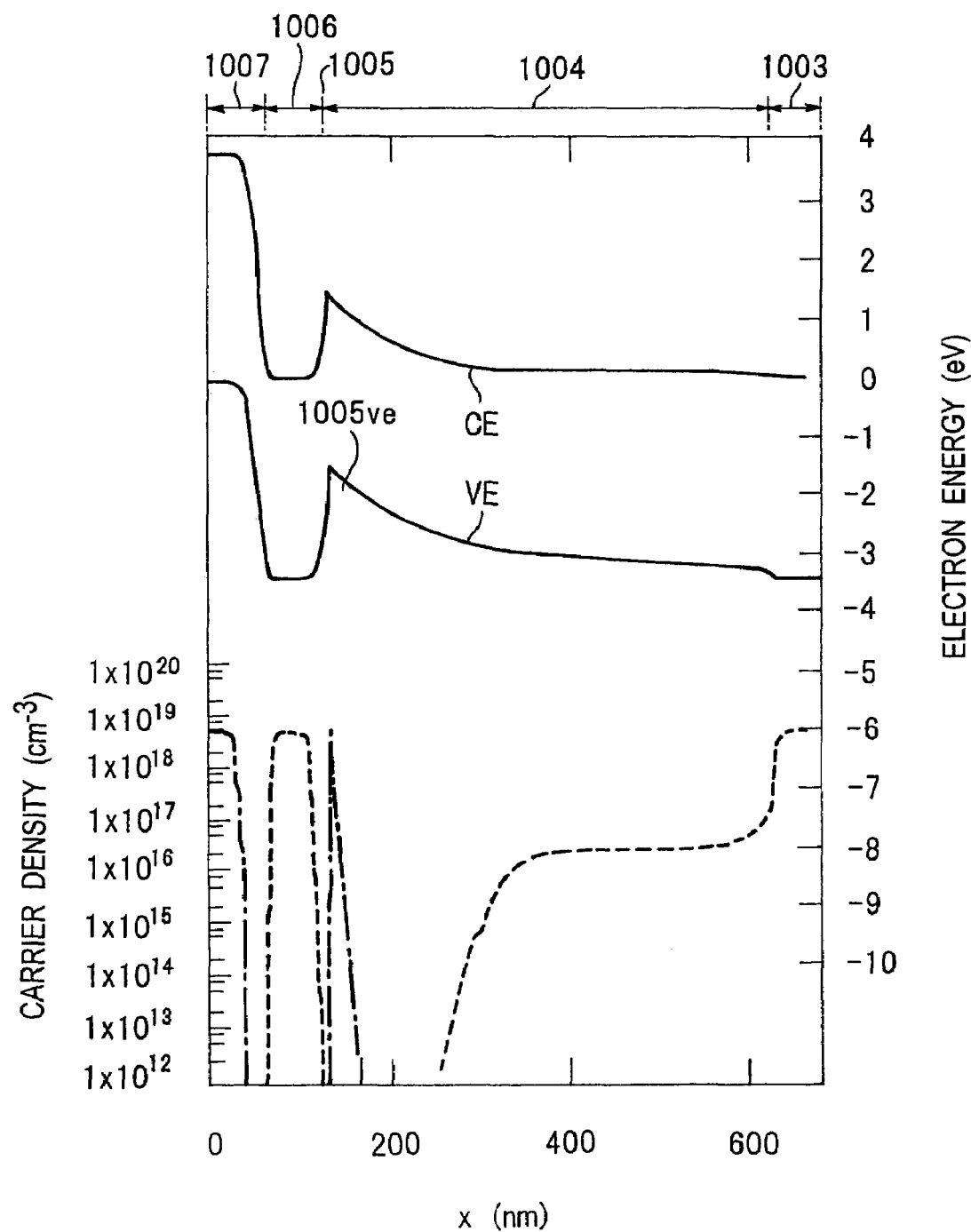
FIG. 11 is a graph showing the energy band and the densities of electrons and holes of the device shown in FIG. 10 in a thermal equilibrium state.

FIG. 11 shows the energy band and the densities of electrons and holes as the result of simulating the device of FIG. 10 by means of a simulation model. In this FIG. 11, no voltage bias is applied to the layers, and a thermal equilibrium state is established. During operation, holes that are injected from the gate layer 1007 and diffused in the emitter layer 1006 and reach the 2DHG layer 1005 are temporarily retained in (the neighborhood of an edge 1005ve of the valence band of) the 2DHG layer 1005.

In detail, a forward bias is applied between the gate layer 1007 and the emitter layer 1006 shown in FIG. 10 during operation, and therefore, holes are first injected from the gate layer 1007 into the emitter layer 1006. The holes injected from the gate layer 1007 into the emitter layer 1006 diffuse mainly in the vertical direction (indicated by the arrow h1 in FIG. 10) in the emitter layer 1006 and reach the 2DHG layer 1005. Then, the holes are retained in the 2DHG layer 1005, and the holes in the 2DHG layer 1005 become excessive, so that a potential barrier between the emitter layer 1006 and the 2DHG layer 1005 is lowered. This consequently causes injection of electrons from the emitter layer 1006 into the 2DHG layer 1005. Then, the excessive holes retained in the 2DHG layer 1005 are all recombined with (a part of) the injected electrons. At this time, the majority of the electrons injected from the emitter layer 1006 into the 2DHG layer 1005 pass through the 2DHG layer 1005 and reach the collector layer 1004 and the subcollector layer 1003. That is, electrons flow in the vertical direction (indicated by the arrow e1 in FIG. 10) from the emitter layer 1006 to the collector layer 1004 and the subcollector layer 1003 through the 2DHG layer 1005. The transistor operates as described above. Since the current of electrons is larger than the current of holes, a current gain is caused.

In this case, since the thickness of the 2DHG layer 1005 is smaller than the thickness of the p-type base layer 705 (see FIG. 7), a recombination current is reduced. Therefore, $\alpha_2$ in the aforementioned equation (3) becomes closer to $\alpha_1$, so that the direct current gain $\beta_0$ becomes higher.

(The Third Embodiment)

Figure 12:
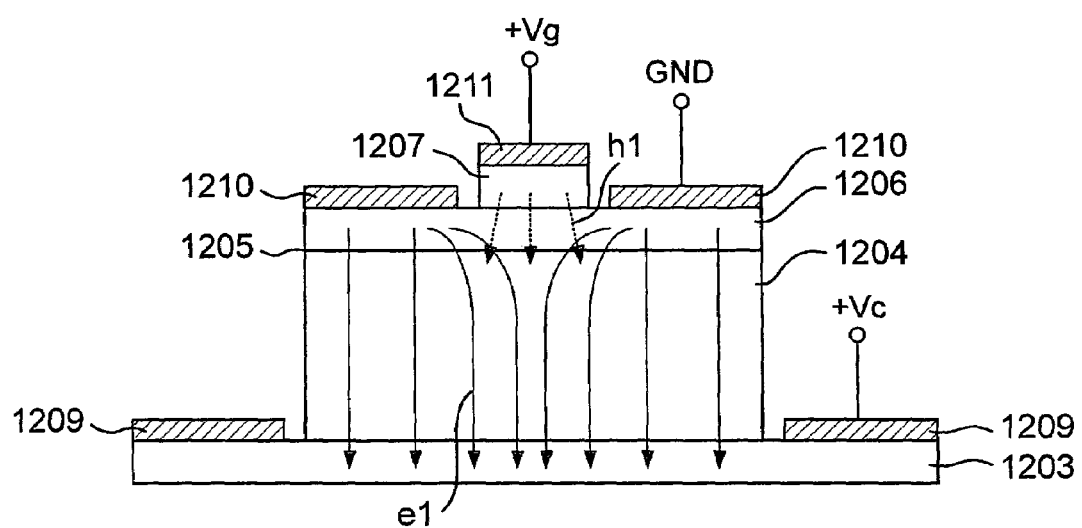
FIG. 12 is a view showing the cross-sectional structure of a bipolar transistor of a third embodiment to which this invention is applied.

FIG. 12 shows the cross-sectional structure of the device of the third embodiment to which this invention is applied.

This device is provided with an n-GaN subcollector layer (layer thickness: 100 nm, $N_d=5\times10^{18}$ cm$^{-3}$) 1203, an n-In$_x$Ga$_{1-x}$N collector layer (layer thickness: 500 nm, In composition ratio x=0→0.2, $N_d=1\times10^{16}$ cm$^{-3}$) 1204 formed in a central region of the upper surface of this subcollector layer 1203, an n-GaN emitter layer (layer thickness: 80 nm, $N^d=5\times10^{18}$ cm$^{-3}$) 1206 and an Al$_x$Ga$_{1-x}$N gate layer (layer thickness: 25 nm, Al composition ratio x=0.1→0.3, undoped) 1207 formed in a central region of the upper surface of this emitter layer 1206. The In crystal mixture ratio x of the n-In$_x$Ga$_{1-x}$N collector layer 1204 is graded so that x=0 on the subcollector layer side and x=0.2 on the emitter layer side. Moreover, the Al crystal mixture ratio x of the Al$_x$Ga$_{1-x}$N gate layer 1207 is graded so that x=0.1 on the emitter layer side and x=0.3 on the upper surface side.

The collector electrode 1209, the emitter electrode 1210 and the gate electrode 1211 are formed similarly to those of the first and second embodiments. The collector electrode 1209, the emitter electrode 1210 and the gate electrode 1211 are put in ohmic contact with the subcollector layer 1203, the emitter layer 1206 and the gate layer 1207, respectively, which are located just under the electrodes.

As understood, the structure of this device corresponds to one obtained by replacing the p-Al$_{0.2}$Ga$_{0.8}$N gate layer 1007 in the device of the second embodiment with the undoped Al$_x$Ga$_{1-x}$N gate layer 1207. The structure of this device will be described next.

Polarized electric charge is generated by spontaneous polarization if the gate layer has a graded crystal mixture ratio. There is a possibility that a three-dimensional hole gas (3DHG) is generated in the case of the crystal mixture ratio grading. If the density of 3DHG generated in the gate layer is sufficiently high, then the gate layer is not required to undergo p-type doping.

Accordingly, the device of this third embodiment is provided with the undoped $Al_xGa_{1-x}N$ gate layer 1207 as already described. An interface (including its neighborhood region, hereinafter referred to as a "2DHG layer") 1205 constituted of the emitter layer 1206 and the collector layer 1204 operates as a second conductive type carrier retaining layer similarly to the second embodiment.

Figure 13:
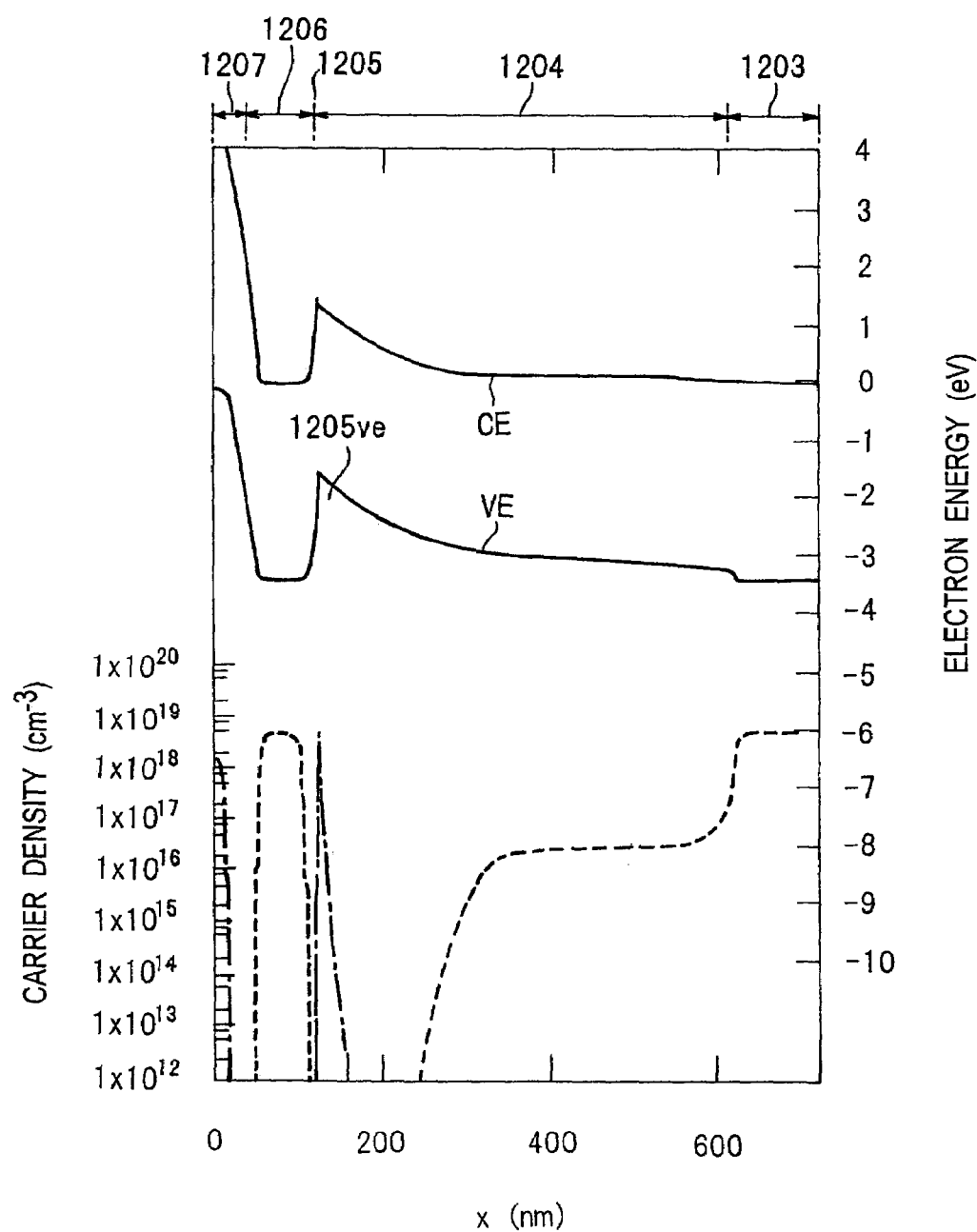
FIG. 13 is a graph showing the energy band and the densities of electrons and holes of the device shown in FIG. 12 in a thermal equilibrium state.

FIG. 13 shows the energy band and the concentrations of electrons and holes as the result of simulating the device of FIG. 12 by means of a simulation model. In this FIG. 13, no voltage bias is applied to the layers, and a thermal equilibrium state is established. During operation, holes that are injected from the gate layer 1207 and diffused in the emitter layer 1206 and reach the 2DHG layer 1205 are temporarily retained in (the neighborhood of an edge 1205ve of the valence band of) the 2DHG layer 1205. The other actions are similar to those of the second embodiment.

In the devices of the first through third embodiments, the current gain β(f) at a high frequency is expressed by the following equations (4):

$$\beta(f) = 1/(2\pi f \tau_2) - \tau_1/\tau_2$$

$$\tau_1 = x_e^2/(2D_p)$$

$$\tau_2 = (C_{ge} + C_{ce})kT/(qI_c) + x_b^2/(2D_n) + x_t/(2v_{sn}) \quad (4)$$

where f represents the frequency, $x_e$ represents the thickness of the emitter layer, $x_b$ represents the thickness of the base layer, $D_p$ represents the diffusion coefficient of holes, $D_n$ represents the diffusion coefficient of electrons, $x_t$ represents the thickness of the collector layer, $C_{ge}$ represents a capacitance between the gate and the emitter, $C_{ce}$ represents a capacitance between the collector and the emitter, k represents the Boltzman's constant, T represents the temperature, q represents the amount of electric charge of electrons, $I_c$ represents the collector current, and $v_{sn}$ represents the saturation velocity of electrons. Moreover, $\tau_1$ represents a time of delay due to the movement of holes, and $\tau_2$ represents a times of delay due to the movement of electrons. It is to be noted that the base layer is eliminated (2DHG layer is provided as a substitute) in the case of the device of the second embodiment (FIG. 10) and the device of the third embodiment (FIG. 12), and therefore, $x_b$ is 0 nm.

Figure 14:
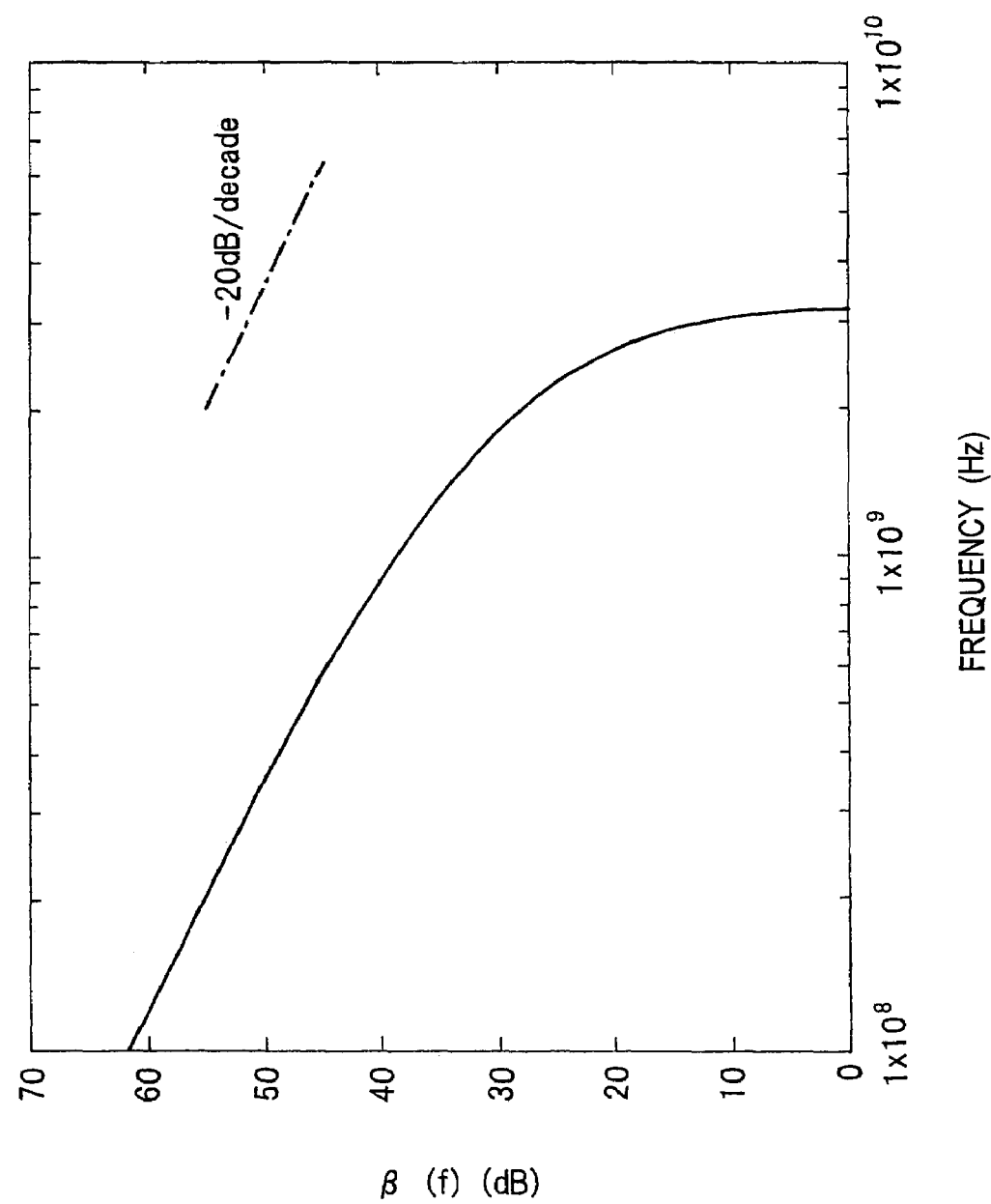
FIG. 14 is a graph showing the high-frequency current gain characteristic of a device to which this invention is applied.

FIG. 14 shows a graph of β(f) with respect to f. In this case, the parameters are set so that $x_e$=50 nm, $x_b$=0 nm, $D_p$=0.26 $cm^2 s^{-1}$, $x_t$=500 nm and $v_{sn}$=2×10$^7$ $cms^{-1}$.

Since the delay time of holes scarcely exerts influence in the frequency range of $f \ll 1/(2\pi\tau_1)$, with regard to β(f), the characteristic of −20 dB/decade (for the sake of comparison, its slope is indicated by the one-dot chain line in FIG. 14) is shown.

Moreover, in the devices of the first through third embodiments, the unilateral power gain (denoted by the symbol U(f)) at a frequency f in the high-frequency region is expressed by the following equation (5):

$$U(f) = \beta(f)/(8\pi r_e C_{ce} f) \quad (5)$$

where $r_e$ represents the emitter resistance value, and $C_{ce}$ represents the capacitance between the collector and the emitter. Since the emitter layer is the n-type, the sheet resistance is low, and $r_e$ is lower than the base resistance value $r_b$ of the conventional HBT.

In the frequency range of $f \ll 1/(2\pi\tau_1)$, U(f) of the device of the present invention becomes higher than U(f) of the conventional HBT.

THE FIRST EXAMPLE

Figure 4:
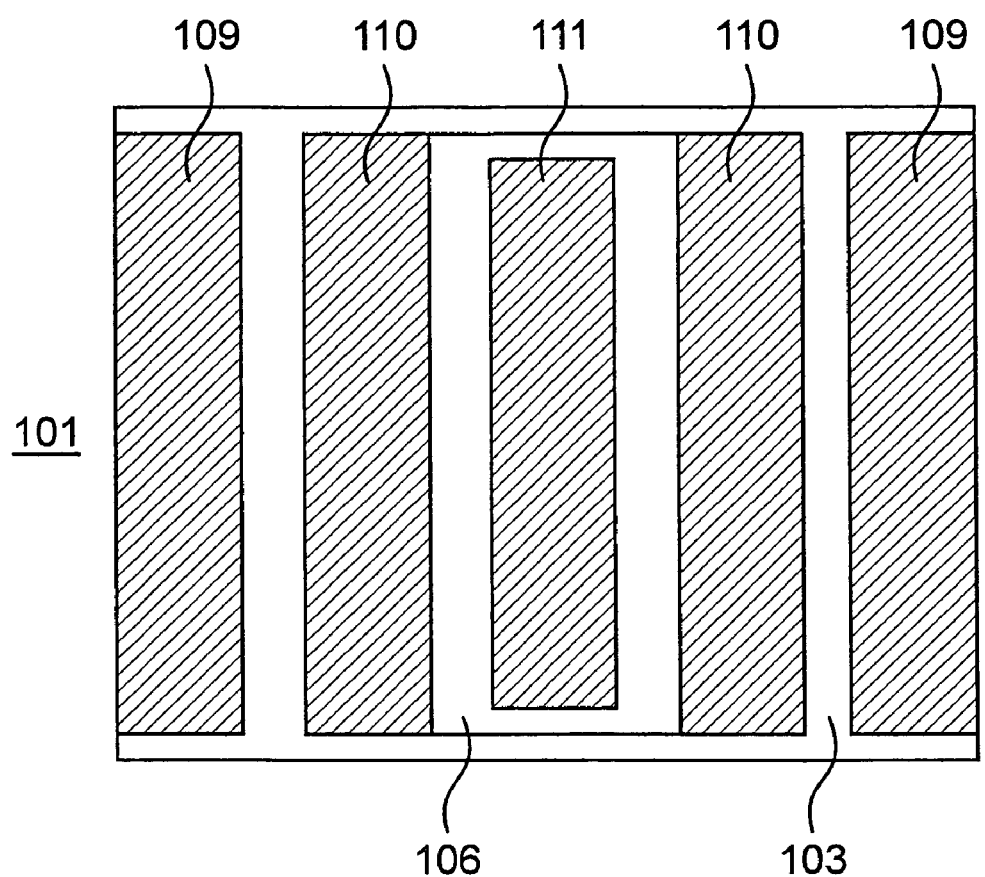
FIG. 4 is a view showing the planar pattern layout of the device of FIG. 1.

FIG. 1 illustrates a more concrete cross-sectional structure of the device (FIGS. 7 through 9) of the first embodiment, and FIG. 4 shows its planar pattern layout.

This device is provided with an AlN buffer layer (layer thickness: 5 nm, undoped) 102, an n-GaN subcollector layer (layer thickness: 500 nm, $N_d$=5×10$^{18}$ $cm^{-3}$) 103, an n-$In_xGa_{1-x}$N collector layer (layer thickness: 500 nm, In composition ratio x=0→0.2, $N_d$=1×10$^{16}$ $cm^{-3}$) 104 formed in a central region of the upper surface of this subcollector layers 103, a p-$In_{0.2}Ga_{0.8}$N base layer (layer thickness: 25 nm, $N^a$=5×10$^{19}$ $cm^{-3}$) 105 that serves as a second conductive type carrier retaining layer, an n-GaN emitter layer (layer thickness: 80 nm, $N_d$=5×10$^{18}$ $cm^{-3}$) 106, a p-$Al_{0.2}Ga_{0.8}$N gate layer (layer thickness: 25 nm, $N_a$=5×10$^{19}$ $cm^{-3}$) 107 formed in a central region of the upper surface of this emitter layer 106 and a GaN gate cap layer (layer thickness: 25 nm, $N_a$=5×10$^{19}$ $cm^{-3}$) 108 on a sapphire substrate 101. The In crystal mixture ratio x of the n-$In_xGa_{1-x}$N collector layer 104 is graded so that x=0 on the subcollector layer side and x=0.2 on the base layer side. In this example, the surface of each semiconductor layer is the (0001) surface.

Collector electrodes 109 and 109 made of Ti/Al/Au are formed in regions of the upper surface of the subcollector layer 103 corresponding to both sides of the collector layer 104. Emitter electrodes 110 and 110 made of Ti/Al/Au are formed in regions of the upper surface of the emitter layer 106 corresponding to both sides of the gate layer 107. Moreover, a gate electrode 111 made of Pd/Au is formed on the upper surface of the gate cap layer 108. The collector electrode 109, the emitter electrode 110 and the gate electrode 111 are put in ohmic contact with the subcollector layer 103, the emitter layer 106 and the gate cap layer 108, respectively, which are located just under the electrodes.

That is, there are the semiconductor layers of p$^+$, n$^+$, p$^+$, n$^-$ and n$^+$ (n$^-$ corresponds to the collector layer 104) in order from the upper side of this device. The base layer 105 is provided with no electrode and electrically floating.

The semiconductor layers 102, 103, 104, 105, 106, 107 and 108 are successively laminated by, for example, the molecular beam epitaxial growth method (MBE) and processed for patterning by the mesa etching method. The electrodes 109, 110 and 111 are vapor-deposited and processed for patterning by the lift-off method. As shown in FIG. 4, the electrodes 109, 110 and 111 are processed into a stripe-shaped pattern in this example.

The width Wc of each collector electrode 109 shown in FIG. 1 is about 5 μm, the width We of each emitter electrode 110 is about 2 μm, and the width Wg of the gate electrode 111 is about 1 μm.

Similarly to the normal HBT, the collector layer 104 has a lower doping concentration and a greater thickness than those of the base layer 105 and the subcollector layer 103. With this arrangement, the withstand voltage is raised, and the output capacitance is reduced.

The doping concentration $N_d$ of the collector layer 104 should preferably be smaller than 1×10$^{17}$ $cm^{-3}$ (i.e. $N^d$<1×10$^{17}$ $cm^{-3}$) and most preferably be not greater than 5×10$^{16}$ $cm^{-3}$ (i.e. $N_d \leq$ 5×10$^{16}$ $cm^{-3}$). The thickness $x_t$ of the collector layer 104 should preferably be greater than 200 nm (i.e. $x_t$>200 nm) and most preferably be not smaller than 300 nm (i.e. $x_t \geqq 300$ nm).

Although the collector layer 104 of this example has the simple composition grading, various collector structures such as a more complicated composition grading are possible.

THE SECOND EXAMPLE

Figure 2:
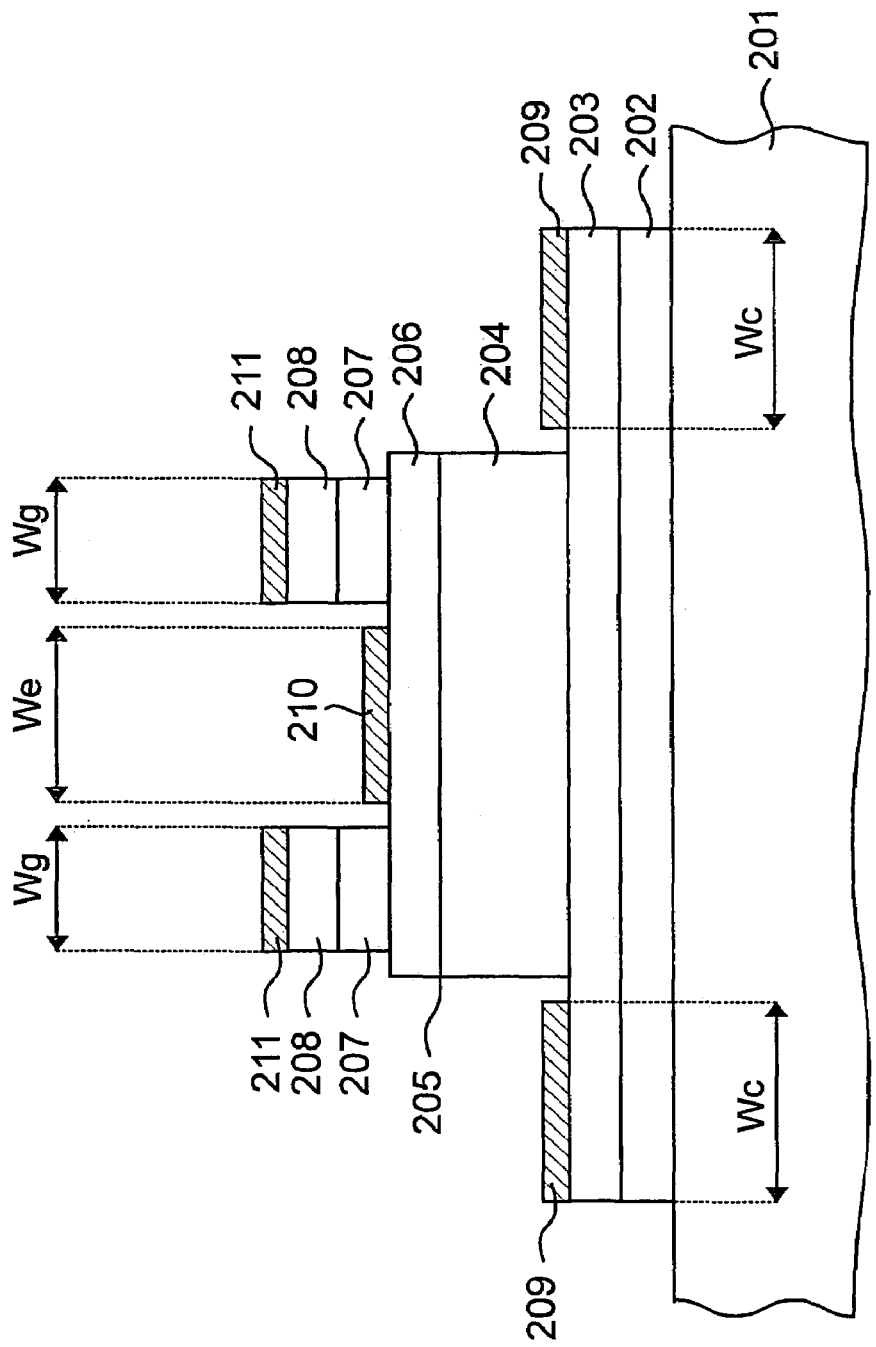
FIG. 2 is a view showing the cross-sectional structure of a second example of the bipolar transistor of this invention.
Figure 5:
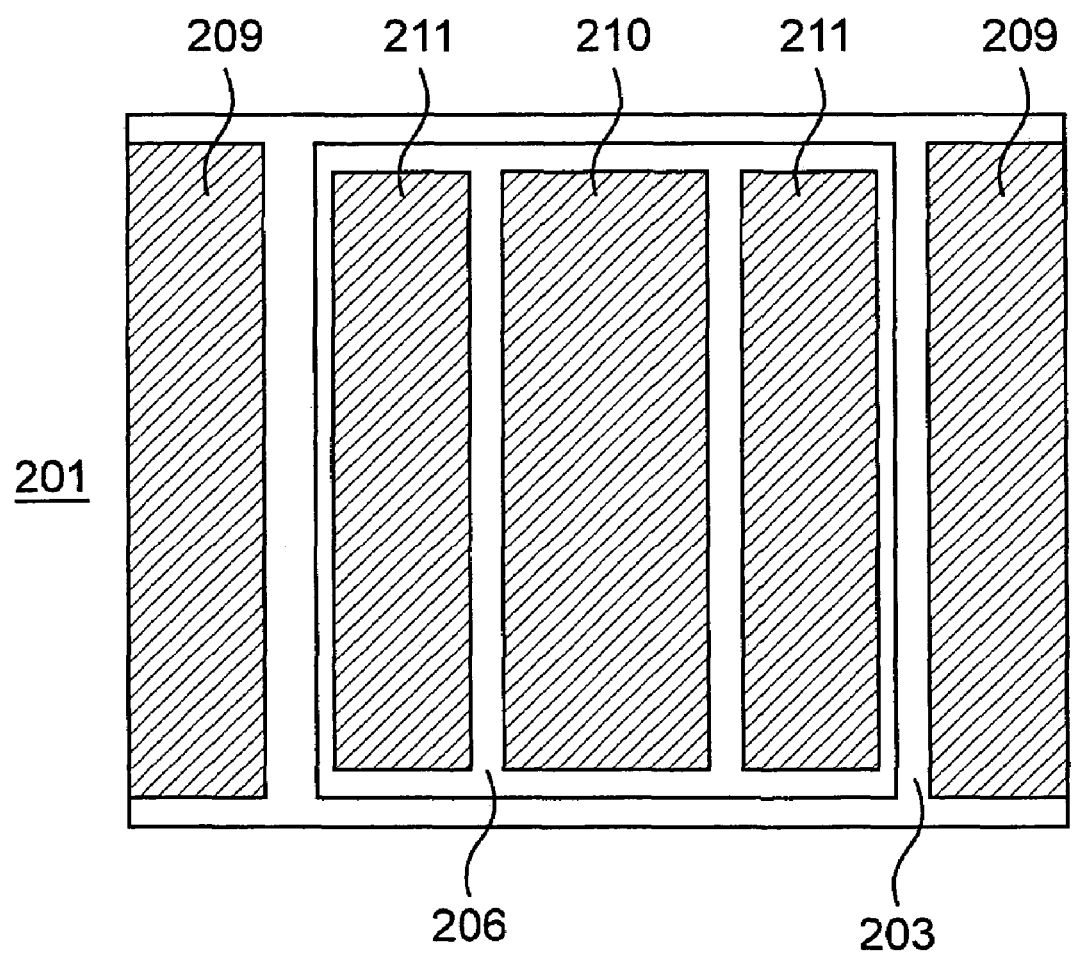
FIG. 5 is a view showing the planar pattern layout of the device of FIG. 2.

FIG. 2 illustrates a more concrete cross-sectional structure of the device (FIGS. 10 and 11) of the second embodiment, and FIG. 5 shows its planar pattern layout.

This device is provided with an AlN buffer layer (layer thickness: 5 nm, undoped) 202, an n-GaN subcollector layer (layer thickness: 500 nm, $N_d=5\times10^{18}$ cm$^{-3}$) 203, an n-In$_x$Ga$_{1-x}$N collector layer (layer thickness: 500 nm, In composition ratio x=0→0.2, $N_d=1\times10^{16}$ cm$^{-3}$) 204 formed in a central region of the upper surface of this subcollector layer 203, an n-GaN emitter layer (layer thickness: 50 nm, $N^d$5×10$^{18}$ cm$^{-3}$) 206, p-Al$_{0.2}$Ga$_{0.8}$N gate layers (layer thickness: 25 nm, $N_a=5\times10^{19}$ cm$^{-3}$) 207, 207 formed in regions located on both sides of the upper surface of this emitter layer 206 and a p-GaN gate cap layers (layer thickness: 25 nm, $N^a=5\times10^{19}$ cm$^{-3}$) 208, 208 on a sapphire substrate 201. The In crystal mixture ratio x of the n-In$_x$Ga$_{1-x}$N collector layer 204 is graded so that x=0 on the subcollector layer side and x=0.2 on the emitter layer side. In this example, the surface of each semiconductor layer is the (000-1) surface.

Collector electrodes 209, 209 made of Ti/Al/Au are formed in regions of the upper surface of the subcollector layer 203 corresponding to both sides of the collector layer 204. An emitter electrode 210 made of Ti/Al/Au is formed in a central region of the upper surface of the emitter layer 206. Moreover, gate electrodes 211, 211 made of Pd/Au are formed on the upper surfaces of the gate cap layers 208, 208, respectively. The collector electrode 209, the emitter electrode 210 and the gate electrode 211 are put in ohmic contact with the subcollector layer 203, the emitter layer 206 and the gate cap layer 208, respectively, which are located just under the electrodes.

That is, there are the semiconductor layers of p$^+$, n$^+$, n$^-$ and n$^+$ (n$^-$ corresponds to the collector layer 204) in order from the upper side in this device.

In this example, there is no p-type base layer, and an interface (including its neighborhood region, hereinafter referred to as a "2DHG layer") 205 between the emitter layer 206 and the collector layer 204 operates as a second conductive type carrier retaining layer. Since the surface of each semiconductor layer is the (000-1) surface, the density of the two-dimensional hole gas in the 2DHG layer 205 is sufficiently raised.

The semiconductor layers 202, 203, 204, 206, 207 and 208 are successively laminated by, for example, the molecular beam epitaxial growth method (MBE) and processed for patterning by the mesa etching method. The electrodes 209, 210 and 211 are vapor-deposited and processed for patterning by the lift-off method. As shown in FIG. 5, the electrodes 209, 210 and 211 are processed into a stripe-shaped pattern in this example.

The width Wc of each collector electrode 209 shown in FIG. 2 is about 5 μm, the width We of the emitter electrode 210 is about 3 μm and the width Wg of each gate electrode 211 is about 1 μm.

THE THIRD EXAMPLE

Figure 3:
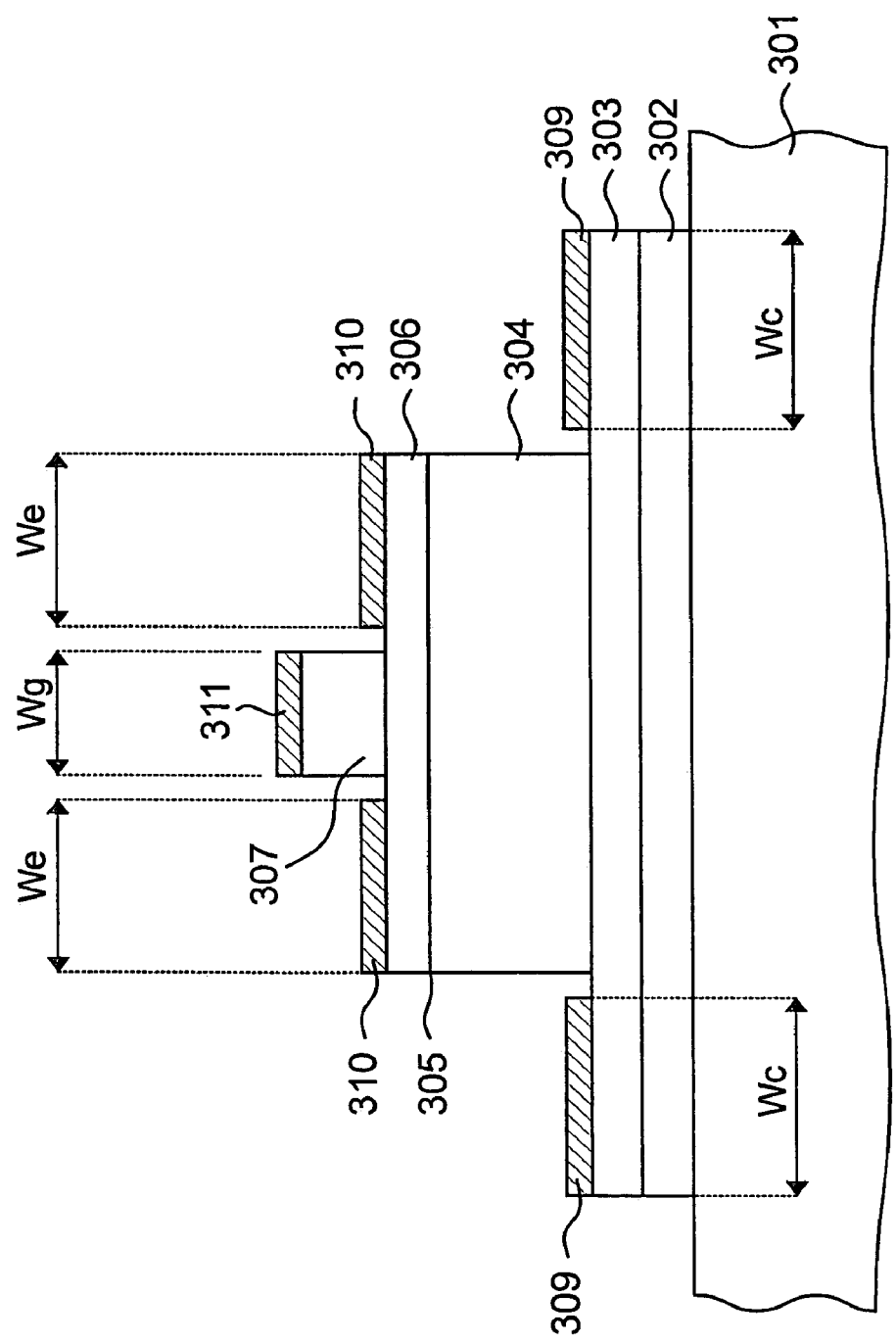
FIG. 3 is a view showing the cross-sectional structure of a third example of the bipolar transistor of this invention.

FIG. 3 illustrates a more concrete cross-sectional structure of the device (FIGS. 12 and 13) of the third embodiment.

This device is provided with an AlN buffer layer (layer thickness: 5 nm, undoped) 302, an n-GaN subcollector layer (layer thickness: 500 nm, $N_d=5\times10^{18}$ cm$^{-3}$) 303, an n-In$_x$Ga$_{1-x}$N collector layer (layer thickness: 500 nm, In composition ratio x=0→0.2, $N_d=1\times10^{16}$ cm$^{-3}$) 304 formed in a central region of the upper surface of this subcollector layer 303 and an n-GaN emitter layer (layer thickness: 50 nm, $N^d=5\times10^{18}$ cm$^{-3}$) 306 and a Al$_x$Ga$_{1-x}$N gate layer (layer thickness: 25 nm, x=0.1→0.3, undoped) 307 formed in a central region of the upper surface of this emitter layer 306 on a sapphire substrate 301. The In crystal mixture ratio x of the n-In$_x$Ga$_{1-x}$N collector layer 304 is graded so that x=0 on the subcollector layer side and x=0.2 on the emitter layer side. Moreover, the Al crystal mixture ratio x of the Al$_x$Ga$_{1-x}$N gate layer 307 is graded so that x=0.1 on the emitter layer side and x=0.3 on the upper surface side. In this example, the surface of each semiconductor layer is the (000-1) surface.

Collector electrodes 309, 309 made of Ti/Al/Au are formed in regions of the upper surface of the subcollector layer 303 corresponding to both sides of the collector layer 304. Emitter electrodes 310, 310 made of Ti/Al/Au are formed in regions of the upper surface of the emitter layer 306 corresponding to both sides of the gate layer 307. Moreover, a gate electrode 311 made of Pd/Au is formed on the upper surface of the gate layer 307. The collector electrode 309, the emitter electrode 310 and the gate electrode 311 are put in ohmic contact with the subcollector layer 303, the emitter layer 306 and the gate layer 307, respectively, which are located just under the electrodes.

That is, there are the semiconductor layers of i, n$^+$, n$^-$ and n$^+$ (i corresponds to the gate layer 307, and n$^-$ corresponds to the collector layer 304) in order from the upper side in this device.

In this example, there is no p-type base layer, and an interface (including its neighborhood region, hereinafter referred to as a "2DHG layer") 305 between the emitter layer 306 and the collector layer 304 operates as a second conductive type carrier retaining layer. Since the surface of each semiconductor layer is the (000-1) surface, the density of the two-dimensional hole gas in the 2DHG layer 305 is sufficiently raised.

Further, the gate layer 307 has a crystal mixture ratio grading such that the Al crystal mixture ratio x of the gate layer 307 is x=0.1 on the emitter side and x=0.3 on the gate electrode side. The amount of the spontaneous polarized electric charge is increased due to the great Al crystal mixture ratio x on the gate electrode side, and the density of the three-dimensional hole gas is sufficiently raised. Therefore, the gate layer 307 needs no p-type dopant. Moreover, the gate layer 307 has an energy bandgap greater than that of the emitter layer 306, and therefore, electron injection from the emitter can be restrained.

The semiconductor layers 302, 303, 304, 306, 307 and 308 are successively laminated by, for example, the molecular beam epitaxial growth method (MBE) and processed for patterning by the mesa etching method. The electrodes 309, 310 and 311 are vapor-deposited and processed for patterning by the lift-off method. In this example, similarly to the first example (FIG. 4), the electrodes 309, 310 and 311 are processed into a stripe-shaped pattern.

Figure 6:
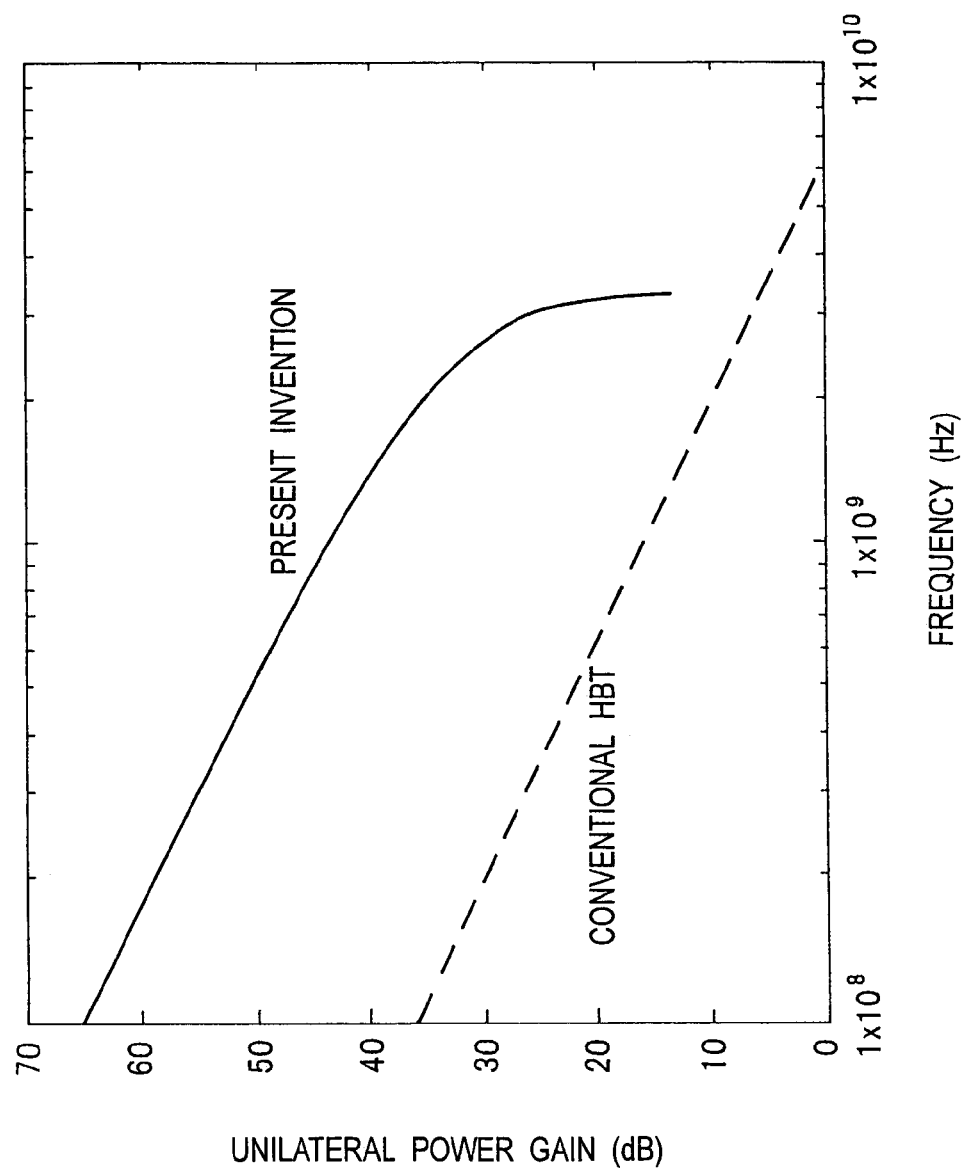
FIG. 6 is a graph showing the unilateral power gain of the device of FIG. 3 in comparison with that of the conventional HBT.

FIG. 6 shows the unilateral power gain U(f) of the device of FIG. 3 calculated on the basis of the aforementioned equation (5) by comparison with the unilateral power gain U(f) of the conventional HBT (which has a uniform base layer) calculated on the basis of the equation (1).

The structural parameters of the device of FIG. 3 are set so that the emitter layer thickness $x_e$=50 nm, base layer thickness $x_b$=0 nm, collector layer thickness $x_f$=500 nm, electron diffusion coefficient $D_n$=26 cm$^2$ s$^{-1}$, electron saturation velocity $v_{sn}$=2×10$^7$ cms$^{-1}$, emitter electrode width We=2 µm, gate electrode width Wg=2 µm and collector electrode width Wc=5 µm.

Figure 15:
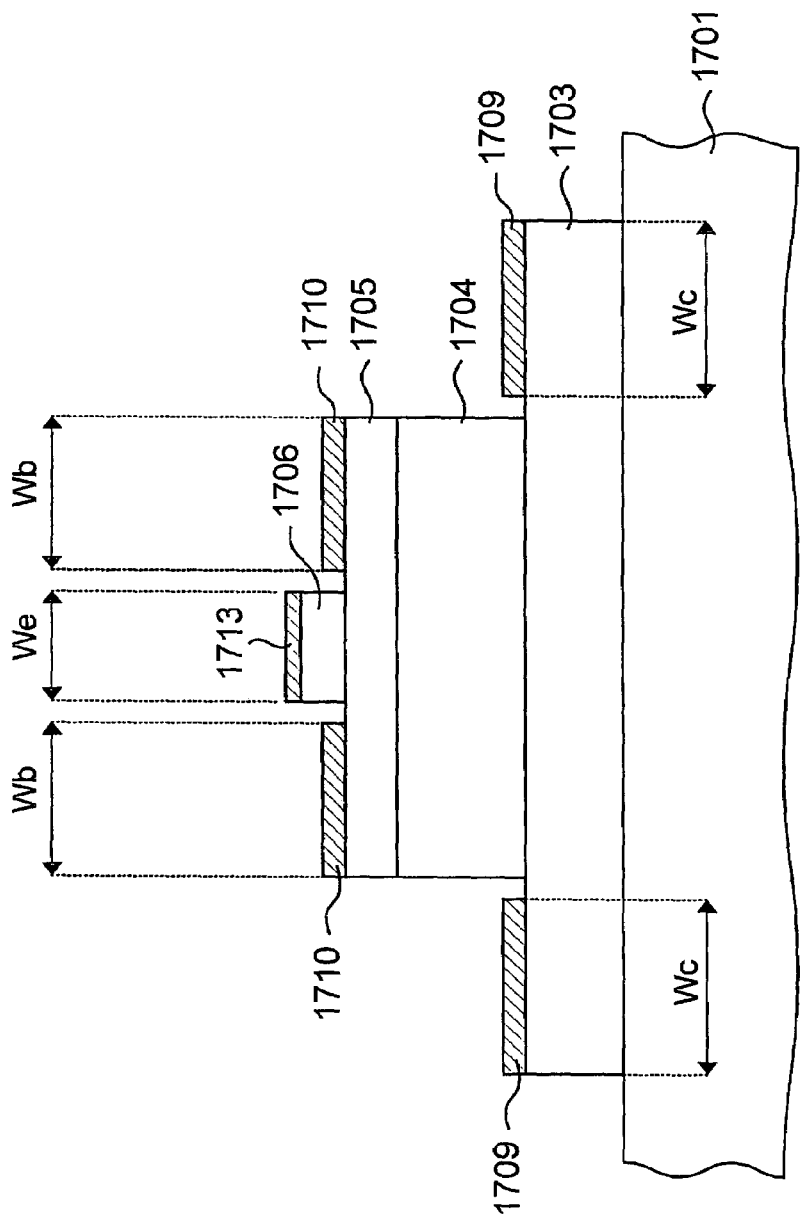
FIG. 15 is a view showing the cross-sectional structure of the conventional HBT that has a uniform base layer.

On the other hand, as shown in FIG. 15, the conventional HBT is provided with an n-GaN subcollector layer ($N^d$=1×10$^{18}$ cm$^{-3}$) 1703, an n-GaN collector layer ($N_d$=5×10$^{16}$ cm$^{-3}$) 1704, a p-GaN base layer ($N_a$=5×10$^{19}$ cm$^{-3}$) 1705 and an n-Al$_{0.1}$Ga$_{0.9}$N emitter layer ($N_d$=1×10$^{18}$ cm$^{-3}$) 1706 on a sapphire substrate 1701. There are provided Ti/Al/Au collector ohmic electrodes 1709, a Ti/Al/Au emitter ohmic electrode 1713 and Pd/Au base ohmic electrodes 1710. The structural parameters of this conventional HBT are set so that the emitter layer thickness $x_e$=100 nm, base layer thickness $x_b$=100 nm, collector layer thickness $x_f$=500 nm, electron diffusion coefficient Dn=26 cm$^2$ s$^{-1}$, electron saturation velocity $v_{sn}$=2×10$^7$ cms$^{-1}$, emitter electrode width We=2 µm, base electrode width Wb=2 µm and collector electrode width Wc=5 µm. The surface of each semiconductor layer is the (0001) surface.

As is apparent from this FIG. 6, U(f) of the device of the present invention is higher than U(f) of the conventional HBT in a frequency region f<<1/(2π$τ_1$).

Although the emitter electrode is grounded in the above description, it is also effective to ground a terminal other than the emitter electrode.

Although the semiconductor layers have been grown on the sapphire substrate in the aforementioned examples, the device of this invention is also effective even if a substrate other than sapphire is employed. Particularly, when the compound semiconductor of the group III element and nitrogen (N) is used as the material, it is possible to employ an SiC substrate, an Si substrate, an AlN substrate, or a GaN substrate.

Moreover, although the MBE method has been adopted as the growth method of the semiconductor layers in the aforementioned examples, a growth method other than the MBE method can also be adopted. Particularly, when the compound semiconductor of the group III element and nitrogen (N) is used as the material, the metal organic chemical vapor deposition (MOCVD) and the hydride vapor phase epitaxy (HVPE) can be effectively used.

Various semiconductor materials can be effectively used in constituting the device of this invention. However, this invention is particularly effective in the case of a semiconductor in which the electron and mobility $µ_n$ and the hole mobility $µ_p$ are largely different from each other. In the case of GaAs, whose $µ_n$=8000 cm$^2$V$^{-1}$ s$^1$, $µ_p$=400 cm$^2$V$^{-1}$ s$^{-1}$ and $µ_n/µ_p$=20, present invention is rather effective. However, in the case of GaN used as a material, whose $µ_n$=1000 cm$^2$ V$^{-1}$ s$^{-1}$, $µ_p$ =10 cm$^2$ V$^{-1}$ s$^{-1}$ and $µ_n/µ_p$=100, the present invention is particularly effective. In addition, since the activation rate of the p-type dopant of GaN is low, the resistance value of the p-type GaN layer is further increased, and the characteristic becomes worsened in the high-frequency region in the HBT that has the conventional structure. In contrast to this, the bipolar transistor of the present invention has the structure of which the performance is not influenced by the sheet resistance of the base layer, and therefore, a high current gain can be exhibited even in the high-frequency region. Therefore, if the present invention is applied to the bipolar transistor that includes GaN as the material, the degree of improvement of the performance of the transistor is particularly great.

(The Fourth Embodiment)

By providing an electronic apparatus with the bipolar transistor of the present invention, there can be provided the electronic apparatus that has low power consumption. The bipolar transistor of the present invention, which can exhibit a high current gain also in the high-frequency region, is therefore suitable particularly for the base station of portable telephones, the base station of a wireless LAN and so on.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bipolar transistor comprising:
   a collector layer which is made of a first conductive type semiconductor;
   an emitter layer which is made of the first conductive type semiconductor provided on the collector layer;
   a gate layer which is provided on the emitter layer and intended to inject second conductive type carriers into the emitter layer; and
   a second conductive type carrier retaining layer which is formed between the collector layer and the emitter layer and temporarily retains the second conductive type carriers that are injected from the gate layer into the emitter layer and diffused in the emitter layer and reach the carrier retaining layer.

2. The bipolar transistor as claimed in claim 1, wherein the collector layer is formed on a substrate.

3. The bipolar transistor as claimed in claim 2, comprising:
   a subcollector layer which is made of a first conductive type semiconductor formed along the substrate between the collector layer and the substrate and is doped with a higher concentration of first conductive type impurity than the collector layer.

4. The bipolar transistor as claimed in claim 3, wherein the collector layer is formed in a partial region on the subcollector layer, a collector electrode is provided in a region of an upper surface of the subcollector layer corresponding to a side of the collector layer,
   the gate layer is formed in a partial region on the emitter layer, an emitter electrode is provided in a region of the upper surface of the emitter layer corresponding to a side of the gate layer, and
   a gate electrode is provided on the gate layer.

5. The bipolar transistor as claimed in claim 1, wherein an energy bandgap of the emitter layer is narrower than an energy bandgap of the gate layer.

6. The bipolar transistor as claimed in claim 1, wherein the second conductive type carrier retaining layer is a base layer which is made of a second conductive type semiconductor.

7. The bipolar transistor as claimed in claim 6, wherein an energy bandgap of the base layer is narrower than an energy bandgap of the emitter layer.

8. The bipolar transistor as claimed in claim 1, wherein the second conductive type carrier retaining layer is a spontaneous polarization layer which is generated at an interface between the collector layer and the emitter layer.

9. The bipolar transistor as claimed in claim 1, wherein a crystalline material which constitutes each of the layers is a compound semiconductor made of a group III element and nitrogen, and the first conductive type is n-type, and the second conductive type is p-type.

10. The bipolar transistor as claimed in claim 6, wherein a crystalline material that constitutes the gate layer is AlGaN, a crystalline material that constitutes the emitter layer is GaN, a crystalline material that constitutes the base layer is InGaN, a crystalline material that constitutes the collector layer is InGaN, and the first conductive type is n-type, and the second conductive type is p-type.

11. The bipolar transistor as claimed in claim 8, wherein a crystalline material that constitutes the gate layer is AlGaN, a crystalline material that constitutes the emitter layer is GaN, a crystalline material that constitutes the collector layer is InGaN, and the first conductive type is n-type, and the second conductive type is ptype.

12. The bipolar transistor as claimed in claim 6, wherein a crystalline material that constitutes the emitter layer is GaN, and the emitter layer has a thickness of not greater than 200 nm.

13. The bipolar transistor as claimed in claim 11, wherein a surface of each of the layers is a (000-1) surface.

* * * * *